(12) United States Patent
Rarick

(10) Patent No.: US 8,433,742 B2
(45) Date of Patent: Apr. 30, 2013

(54) MODULUS-BASED ERROR-CHECKING TECHNIQUE

(75) Inventor: Leonard D. Rarick, San Jose, CA (US)

(73) Assignee: Oracle America, Inc., Redwood Shores, CA (US)

(*) Notice: Subject to any disclaimer, the term of this patent is extended or adjusted under 35 U.S.C. 154(b) by 1300 days.

(21) Appl. No.: 12/187,286

(22) Filed: Aug. 6, 2008

(65) Prior Publication Data

US 2010/0036901 A1    Feb. 11, 2010

(51) Int. Cl.
*G06F 11/10* (2006.01)
*G06F 7/38* (2006.01)

(52) U.S. Cl.
USPC .......................................... 708/532; 708/491

(58) Field of Classification Search ............... 708/491, 708/532
See application file for complete search history.

(56) References Cited

U.S. PATENT DOCUMENTS

| | | | |
|---|---|---|---|
| 3,873,820 A * | 3/1975 | Parr et al. ................ | 708/532 |
| 4,538,238 A * | 8/1985 | Circello et al. ........... | 708/491 |
| 4,924,467 A * | 5/1990 | Criswell ................... | 714/820 |
| 8,081,629 B2 * | 12/2011 | Miller et al. .............. | 370/390 |

FOREIGN PATENT DOCUMENTS

SU         396688    *  1/1974

* cited by examiner

*Primary Examiner* — Chuong D Ngo
(74) *Attorney, Agent, or Firm* — Park, Vaughan, Fleming & Dowler, LLP; Steven E. Stupp

(57) ABSTRACT

During a method, a modulus circuit determines a modulus base p of a first number and a modulus base p of a second number. Also, the modulus circuit performs the operation using the modulus base p of the first number and the modulus base p of the second number, and calculates a modulus base p of the result of the operation involving the first number and the second number. Next, the modulus circuit compares the result of the operation carried out on the modulus base p of the first number and the modulus base p of the second number with the modulus base p of the operation performed on the first number and the second number to identify potential errors associated with the operation. Moreover, the modulus circuit repeats the method to identify additional potential errors associated with the operation, where the determining and calculating operations are repeated using moduli base q.

20 Claims, 6 Drawing Sheets

MODULUS-BASED ERROR-CHECKING TECHNIQUE

BACKGROUND

1. Field of the Invention

The present invention relates to circuits and techniques for performing calculations. More specifically, the present invention relates to circuits and techniques for performing modulus-based error checking of calculations.

2. Related Art

Computers are widely used to perform calculations. For example, a processor in a computer may be used to add two numbers or multiply two numbers. Unfortunately, errors can occur when performing such calculations. Consequently, many existing computers perform error-checking operations to confirm that a processor performed the calculations correctly.

Checking for errors by inverting an operation, such as by performing long division of a product and looking at the remainder, is time consuming and expensive. Instead, in many existing computers error checking is performed by computing moduli. In particular, it is known that mod p (mod p (a)+mod p (b))=mod p (a+b) and mod p (mod p (a)*mod p (b))=mod p (a*b), where mod p is the modulo base p, p is a prime number, and a and b are numbers.

Typically, error checking based on different prime numbers can detect different errors than error checking based on one prime number. Thus, performing error-checking calculations using more than one modulo base can reduce the number of undetected errors. However, this approach typically doubles the area of the error-checking circuit, which is often cost prohibitive.

Hence, there is a need for a technique to perform error checking in computer systems without the above-described problems.

SUMMARY

One embodiment of the present invention provides a method for checking a result of an operation involving a first number and a second number, which may be performed by a modulus circuit. During this method, the modulus circuit determines a modulus base p of the first number and a modulus base p of the second number. Also, the modulus circuit performs the operation using the modulus base p of the first number and the modulus base p of the second number, and calculates a modulus base p of the result of the operation involving the first number and the second number. Next, the modulus circuit compares the result of the operation carried out on the modulus base p of the first number and the modulus base p of the second number with the modulus base p of the operation performed on the first number and the second number to identify potential errors associated with the operation. Moreover, the modulus circuit repeats the determining, calculating, and comparing operations to identify additional potential errors associated with the operation, where the determining and calculating operations are repeated using moduli base q. In some embodiments, p and q are Mersenne prime numbers, and that the moduli base p and base q are computed using a shared circuit that performs additions using subsets of bits in the first number, the second number, and the result of the operation on the first number and the second number. Additionally, the number of bits in a given subset is greater than or equal to the product of a first characteristic number associated with the modulus base p and a second characteristic number associated with the modulus base q.

In some embodiments, the operation includes multiplication or addition, where the multiplication includes a full product of the first number and the second number, or a partial product in which some of the bits in the first number and the second number are multiplied.

In some embodiments, the repeating of the determining, calculating, and comparing operations is performed substantially concurrently with a first instance of these operations.

In some embodiments, the shared circuit performs the additions after logically aligning the subsets of the bits. Moreover, at least some of the additions may be performed using 4-to-2 compressor circuits.

In some embodiments, p is 3 and the first characteristic number is 2, p is 7 and the first characteristic number is 3, or p is 31 and the first characteristic number is 5. Moreover, q may be 3 and the second characteristic number may be 2, q may be 7 and the second characteristic number may be 3, or q may be 31 and the second characteristic number may be 5. Additionally or separately, p may be different than q.

Another embodiment provides the modulus circuit, which is configured to determine moduli of an input using shared addition circuits that add subsets of bits in the input, where the input can be the first number, the second number, and/or a result of the operation involving the first number and the second number.

In some embodiments, at least some of the shared addition circuits include full-adder circuits.

In some embodiments, the modulus circuit is disposed on an integrated circuit.

Another embodiment provides a computer system that includes the integrated circuit.

Figure 1:
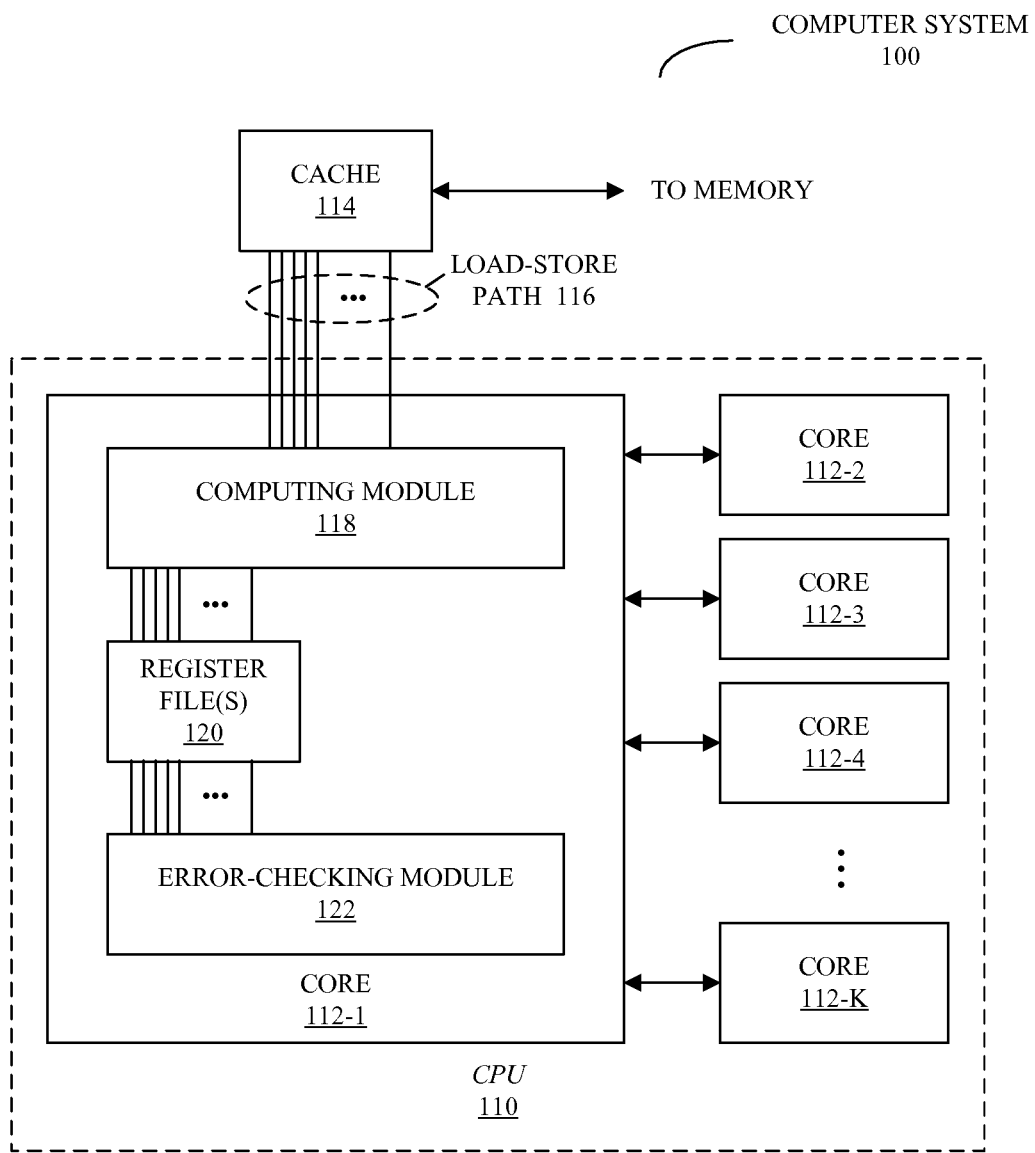
FIG. 1 is a block diagram illustrating a computer system in accordance with an embodiment of the present invention.

Table 1 provides an illustration of a portion of a modulus calculation in accordance with an embodiment of the present invention.

Table 2 provides an illustration of a portion of a modulus calculation in accordance with an embodiment of the present invention.

Table 3 provides an illustration of a portion of a modulus calculation in accordance with an embodiment of the present invention.

Table 4 provides an illustration of a portion of a modulus calculation in accordance with an embodiment of the present invention.

Table 5 provides an illustration of a portion of a modulus calculation in accordance with an embodiment of the present invention.

Table 6 provides an illustration of a portion of a modulus calculation in accordance with an embodiment of the present invention.

Table 7 provides an illustration of a portion of a modulus calculation in accordance with an embodiment of the present invention.

Table 8 provides an illustration of a portion of a modulus calculation in accordance with an embodiment of the present invention.

Table 9 provides an illustration of a portion of a modulus calculation in accordance with an embodiment of the present invention.

Table 10 provides an illustration of a portion of a modulus calculation in accordance with an embodiment of the present invention.

Table 11 provides an illustration of a portion of a modulus calculation in accordance with an embodiment of the present invention.

Table 12 provides an illustration of a portion of a modulus calculation in accordance with an embodiment of the present invention.

Table 13 provides an illustration of a portion of a modulus calculation in accordance with an embodiment of the present invention.

Table 14 provides an illustration of a portion of a modulus calculation in accordance with an embodiment of the present invention.

Table 15 provides an illustration of a portion of a modulus calculation in accordance with an embodiment of the present invention.

Table 16 provides an illustration of a portion of a modulus calculation in accordance with an embodiment of the present invention.

Table 17 provides an illustration of a portion of a modulus calculation in accordance with an embodiment of the present invention.

Table 18 provides an illustration of a portion of a modulus calculation in accordance with an embodiment of the present invention.

Table 19 provides an illustration of a portion of a modulus calculation in accordance with an embodiment of the present invention.

Table 20 provides an illustration of a portion of a modulus calculation in accordance with an embodiment of the present invention.

Table 21 provides an illustration of a portion of a modulus calculation in accordance with an embodiment of the present invention.

Note that like reference numerals refer to corresponding parts throughout the drawings.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a modulus circuit, a system (such as a computer system) that includes the modulus circuit, and a method are described. These circuits, systems and processes may be used to perform error checking of operations, such as adding two numbers or multiplying two numbers (which can include a full product of the two numbers or a partial product of bits in the two numbers). In particular, the modulus circuit may perform the error checking by determining moduli p and q, where p and q are predetermined Mersenne prime numbers (for example, p and/or q may be 3, 7 or 31). In some embodiments, p and q are different.

Moreover, the modulus circuit may determine the moduli base p and base q, at least in part, using a shared circuit that performs additions using subsets of bits in each number. Additionally, the number of bits in a given subset may be greater than or equal to the product of a first characteristic number associated with the modulus base p (such as a number of digits in the binary representation of a value) and a second characteristic number associated with the modulus base q. For example, the number of bits in the given subset may be a positive integer multiple of the number of bits in the binary representation of the modulus p and a positive integer multiple of the number of bits in the binary representation of the modulus q. Note that a given characteristic number N may be defined for a given prime number such that $2^N$ is less than the given prime number and $2^{N+1}$ is greater than or equal to the given prime number.

By sharing at least a portion of the modulus circuit, this technique allows error checking to be performed using two or more moduli, such as moduli p and q, without significantly increasing the area or the cost of the modulus circuit. In particular, the area (and thus, the cost) may be only slightly larger than a separate circuit that only implements modulo p or modulo q (as opposed to an area twice as large).

In the discussion that follows, a characteristic number associated with a modulus may be a positive integer, which is the number of bits in a binary representation of the modulus. For example, the binary representation of 27 is 11011, so the characteristic number of 27 is 5. More generally, the characteristic number of a positive number (not just an integer) is the integer portion of the logarithm of positive the number, where the logarithm is taken with base 2, as opposed to base 10 (common logarithm) or base e (natural logarithm). Furthermore, the characteristic number of a positive number x may have a value N, such that $2^N$ is less than x but $2^{N+1}$ is greater than or equal to x.

We now describe embodiments of a modulus circuit and a computer system that includes the modulus circuit. FIG. 1 presents a block diagram illustrating a computer system 100. Computer system 100 may generally include any type of computer system, including, but not limited to: a computer system based on a processor or microprocessor, a personal computer, a laptop computer, a server, a work station, a mainframe computer, a digital signal processor, a portable computing device, a portable electronic device, a computational engine within an appliance, another device capable of manipulating computer-readable data, and/or in a distributed computing system that communicates information over a network (such as the Internet, World Wide Web or WWW, intranet, LAN, WAN, MAN, or combination of networks, or other technology enabling communication between computing systems).

Computer system 100 includes a central-processing unit (CPU) 110 which performs computational operations. While performing these computational operations, CPU 110 operates on data items retrieved from cache memory 114 via a load-store path 116. Note that cache memory 114 may be a Level-One (L1) data cache which communicates with a memory subsystem, which may include a Level-Two (L2) unified instruction/data cache and/or a main memory.

CPU 110 includes multiple cores 112. One or more of these cores 112 includes computing circuit or module 118 (for example, in an execution unit), which executes instructions that perform operations (such as addition or multiplication) on two or more numbers. Results of these operations may be stored (at least temporarily) in one or more register files 120.

Moreover, error-checking circuit or module 122 may determine moduli p and q of the two or more numbers and/or the intermediate or final results, as described further below. For example, error-checking module 122 may include the modulus circuit. This modulus circuit may be configured to determine the moduli of an input (such as one or more of the two or more numbers, and/or the intermediate or final results) using shared addition circuits (such as full-adder circuits) that add subsets of bits in the input. Note that at least some of the error-checking operations performed by error-checking module 122 may be performed concurrently or independently of one another.

Computer system 100 may include fewer components or additional components. For example, computer system 100 may include multiple CPUs, instead of multiple cores 112 in CPU 110. Moreover, two or more components may be combined into a single component and/or a position of one or more components may be changed. In some embodiments the functionality of computer system 100 may be implemented more in hardware and less in software, or less in hardware and more in software, as is known in the art.

We now describe the modulus-based error-checking technique. As noted previously, for any prime number p and numbers or operands a and b, the sum of the mod p values is equivalent to mod p of the sum, and the product of the mod p values is equivalent to mod p of the product, i.e., $$\mod p \ (\mod p \ (a) + \mod p \ (b)) = \mod p \ (a+b) \quad (1)$$

and $$\mod p \ (\mod p \ (a) * \mod p \ (b)) = \mod p \ (a*b). \quad (2)$$

These facts have been used in some computer systems as a check for proper hardware functioning of a multiplier and/or an adder. For example, mod 11 (9*17)=mod 11 (153)=10 and mod 11 (mod 11 (9)*mod 11 (17))=mod 11 (9*6)=mod 11 (54)=10.

When binary representation is used for numbers a and b, mod 3 is an attractive choice for such error checking. For example, a ten-bit binary value can be represented by the bits 'jihgfedcba' (where each letter is a '1' or a '0'). In this example, the value is (512*j)+(256*i)+(128*h)+(64*g)+(32*f)+(16*e)+(8*d)+(4*c)+(2*b)+(1*a).

Using Eqns. 1 and 2, mod 3(jihgfedcba)=mod 3 ((512*j)+(256*i)+(128*h)+(64*g)+(32*j)+(16*e)+(8*d)+(4*c)+(2*b)+(1*a))=mod3 ((2*j)+(1*i)+(2*h)+(1*g)+(2*j)+(1*e)+(2*d)+(1*c)+(2*b) +(1*a)). Note that terms such as (2*b)+(1*a) can be grouped as two-bit numbers. Thus, mod 3 (jihgfedcba) can be determined by calculating mod3 (ji+hg+fe+dc+ba).

In some embodiments, a carry-save adder used for multiplication, which uses floating-point double precision (where the mantissa size is 53 bits, including the 52 explicit bits and a leading 1 implicit bit), can be checked using mod 3. In particular, represent one of the inputs to the carry-save adder for the multiplier as 1ZYXWVUTSRQPONMLKJIHGFED-CBAzyxwvutsrqponmlkjihgfedcba, where the implicit 1 bit is represented as '1' and the 52 explicit bits are represented by letters of the alphabet. (Note that this approach can also be applied to a single-precision number or an integer.) Then, as shown in Table 1, mod 3 (1ZYXWVUTSRQPONMLKJIH-GFEDCBAzyxwvutsrqponmlkjihgfedcba) can be re-expressed using Eqns. 1 and 2. In Table 1, note that '1' is the implicit bit, and that two-bit values determine the mod 3 of a sum.

TABLE 1

| mod 3 (1 |
|---|
| + ZY |
| + XW |
| + VU |
| + TS |
| + RQ |
| + PO |
| + NM |
| + LK |
| + JI |
| + HG |
| + FE |
| + DC |
| + BA |
| + zy |
| + xw |
| + vu |
| + ts |
| + rq |
| + po |
| + nm |
| + lk |
| + ji |
| + hg |
| + fe |
| + dc |
| + ba) |

Figure 2A:
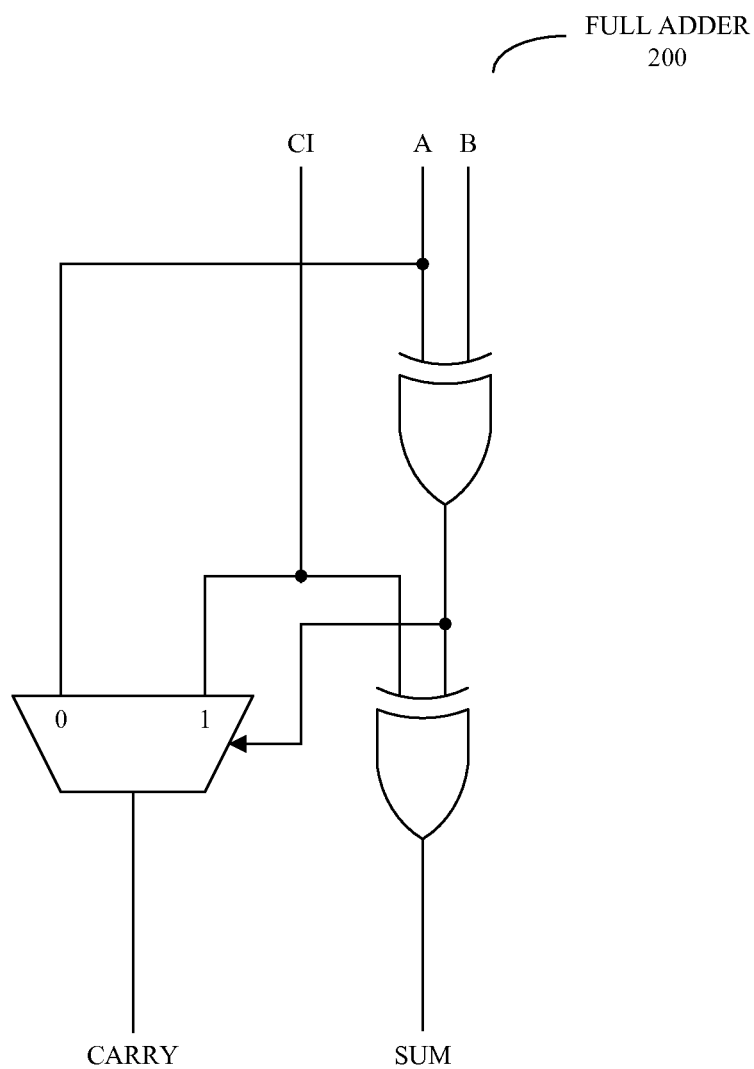
FIG. 2A is a block diagram illustrating a fuller adder in accordance with an embodiment of the present invention.

Grouping three lines at a time in Table 1 and using full adders, such as full adder 200 in FIG. 2A which has three inputs (such as e, c and a in the 1's position in Table 2, column 9, rows 1-3, or f, d and b in the 2's position in Table 2, column 9, rows 1-3) and two outputs (sum and carry), mod 3 can be expressed as shown in Table 2. In Table 2, 'SS' represents the two sum bits output from the two full adders associated with a given column in Table 2, and 'KC' represents the two carry bits output from the two full adders associated with the given column in Table 2. Note that these addition operations can be computed in parallel. In addition, note that the K bit may be placed in the least significant bit position of the subsequent full adder because mod 3 (4)=1. After completing the full additions, the 53 initial bits may be reduced to 36 bits. Moreover, noted for area evaluation, the operations shown in Table 2 may include 18 full adders.

TABLE 2

| 01 | VU | PO | JI | DC | Xw | rq | lk | fe |
|---|---|---|---|---|---|---|---|---|
| + ZY | + TS | + NM | + HG | + BA | + vu | + po | + ji | + dc |
| + XW | + RQ | + LK | + FE | + zy | + ts | + nm | + hg | + ba |
| SS | SS | SS | SS | SS | SS | SS | SS | SS |
| + KC | + KC | + KC | + KC | + KC | + KC | + KC | + KC | + KC |
| SS | SS | SS | SS | SS | SS | SS | SS | SS |
| + CK | + CK | + CK | + CK | + CK | + CK | + CK | + CK | + CK |

Repeating this process again, mod 3 can be expressed as shown in Table 3. After the additional full additions, there may be 24 bits. Note that 'CK' in col. 8, row 7 of Table 2 is in col. 6, row 1 of Table 3, 'SS' in col. 9, row 6 of Table 2 is in col. 6, row 2 of Table 3, and 'CK' in col. 9, row 7 of Table 2 is in col. 6, row 3 of Table 3. Moreover, noted for area evaluation, the operations shown in Table 3 may include 12 full adders.

TABLE 3

| SS<br>+ CK<br>+ SS | CK<br>+ SS<br>+ CK | SS<br>+ CK<br>+ SS | CK<br>+ SS<br>+ CK | SS<br>+ CK<br>+ SS | CK<br>+ SS<br>+ CK |
|---|---|---|---|---|---|
| ss<br>+ kc | ss<br>+ kc | ss<br>+ kc | ss<br>+ kc | ss<br>+ kc | ss<br>+ kc |
| ss<br>+ ck | ss<br>+ ck | ss<br>+ ck | ss<br>+ ck | ss<br>+ ck | ss<br>+ ck |

Repeating this process a third time, mod 3 can be expressed as shown in Table 4, where the sum and carry bits are represented by 'x'. Note that the initial 53 bits may be reduced to 16 bits. Moreover, noted for area evaluation, the operations shown in Table 4 may include eight full adders.

TABLE 4

| ss<br>+ ck<br>+ ss | ck<br>+ ss<br>+ ck | ss<br>+ ck<br>+ ss | ck<br>+ ss<br>+ ck |
|---|---|---|---|
| xx<br>+ xx | xx<br>+ xx | xx<br>+ xx | xx<br>+ xx |
| xx<br>+ xx | xx<br>+ xx | xx<br>+ xx | xx<br>+ xx |

Figure 2B:
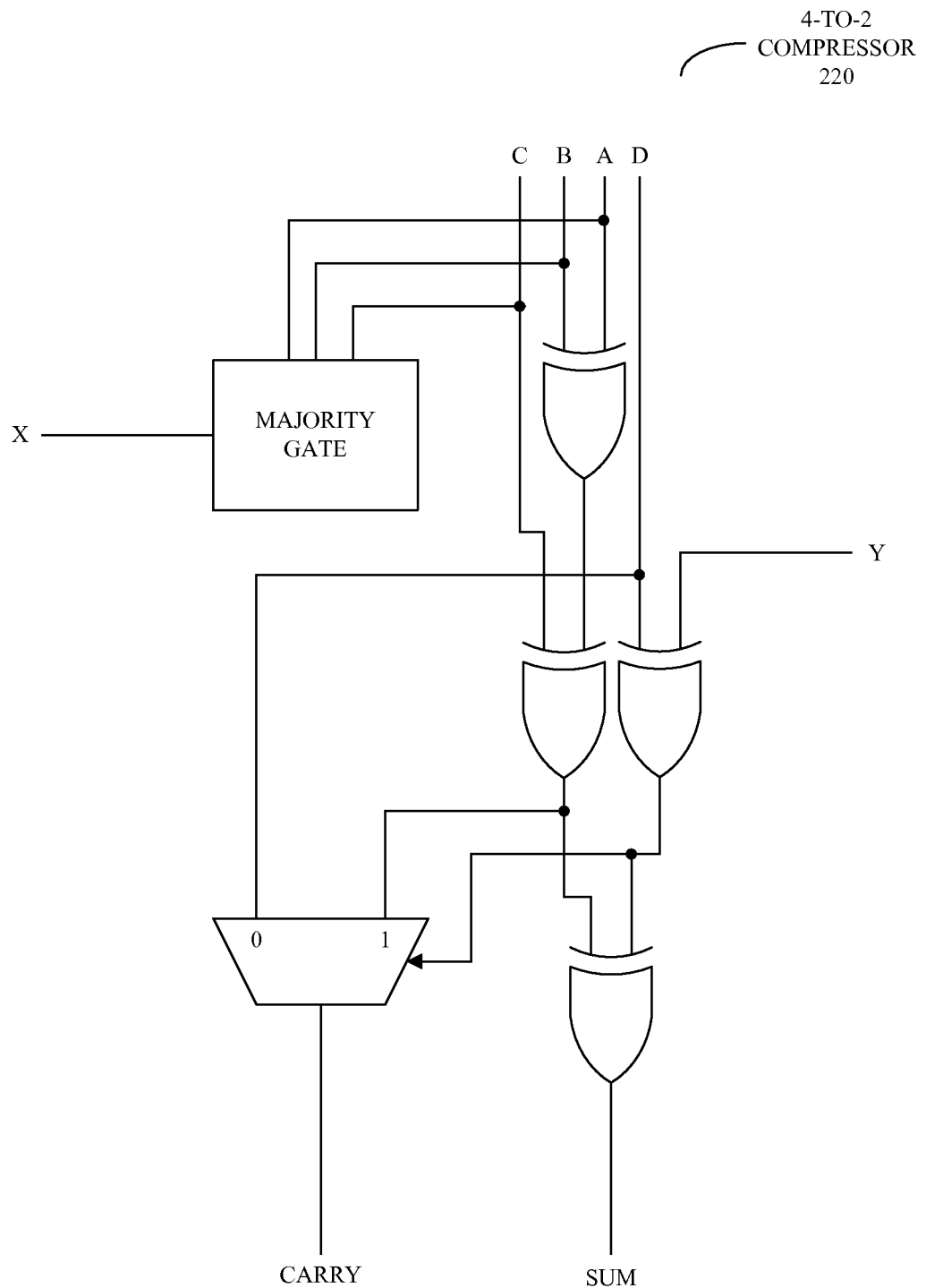
FIG. 2B is a block diagram illustrating a 4-to-2 compressor in accordance with an embodiment of the present invention.
Figure 2C:
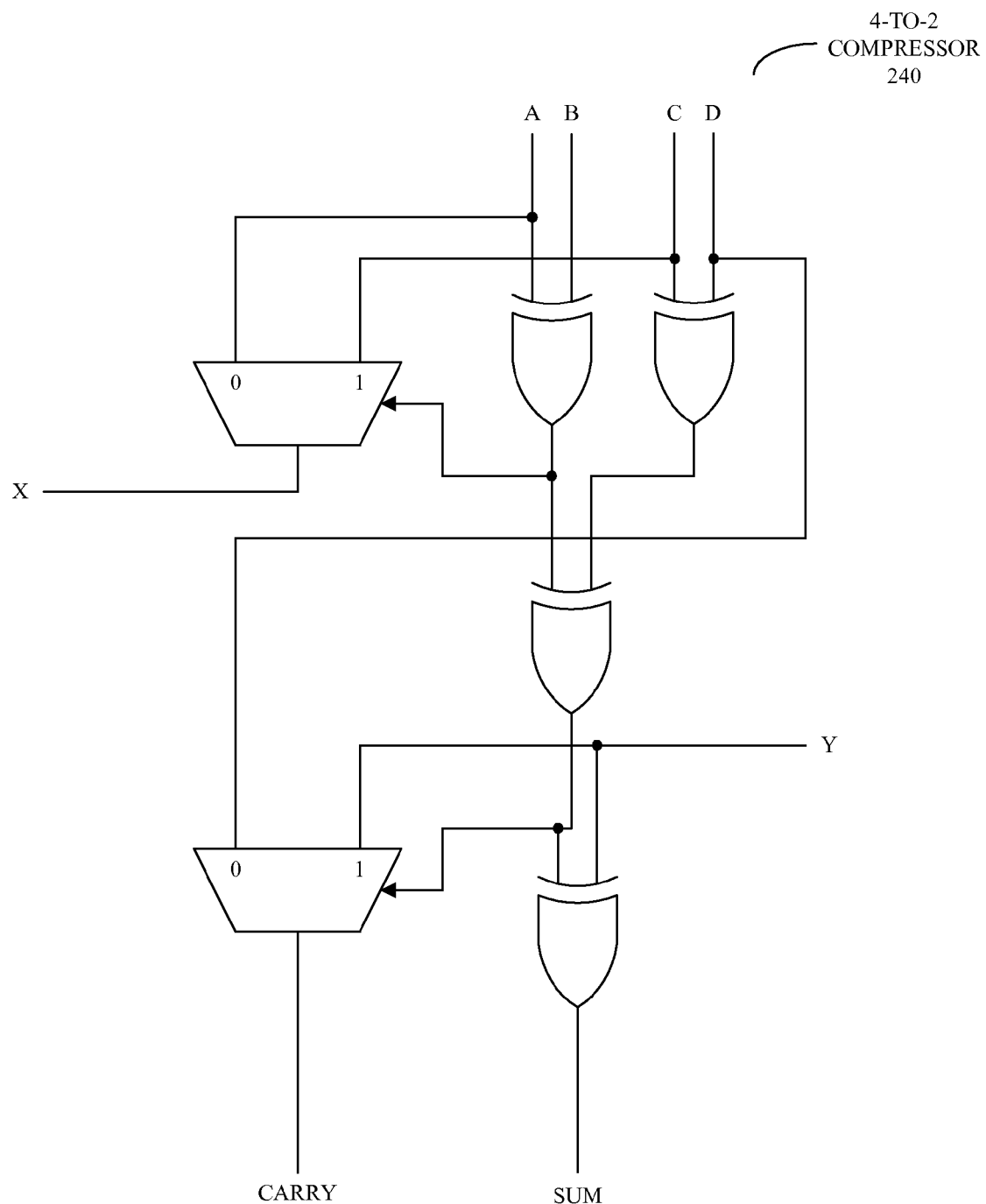
FIG. 2C is a block diagram illustrating a 4-to-2 compressor in accordance with an embodiment of the present invention.

Then, in the fourth group of operations, 4-to-2 compressors (such as 4-to-2 compressor 220 in FIG. 2B, which receives four inputs and a 'late in' bit Y from the 2's position in the previous 4-to-2 compressor, and which outputs a sum and a carry, as well as an 'early out' bit X for the 1's position in the next 4-to-2 compressor), are used, as shown in Table 5. (Note that another embodiment of a 4-to-2 compressor, 4-to-2 compressor 240, is shown in FIG. 2C.) Column 2, rows 1-4 in Table 5 are, respectively, column 4, rows 6-7 and column 3, rows 6-7 in Table 4, and column 1, rows 1-4 in Table 5 are, respectively, column 2, rows 6-7 and column 1, rows 6-7 in Table 4. Note that a 4-to-2 compressor takes the same area as two full adders, so in terms of area, eight additional full adders may be used. Additionally, note that in some embodiments 4-to-2 compressors are used earlier when determining mod 3 (such as in the operations illustrated in Table 3). Moreover, there are a variety of ways to reduce the number of bits when determining mod 3. With 4-to-2 compressors, the 'early out' from the 1's position may be the 'late in' to the 2's position for a given column in Table 5. In traditional usage, the 'early out' from the 2's position would become the 'late in' to the 4's position. However, because mod 3 (4) =1, the 'early out' from the 2's position may be used as the 'late in' to the 1's position (instead of zero for the 'late in' to the 1's position).

TABLE 5

| xx<br>+ xx<br>+ xx<br>+ xx | xx<br>+ xx<br>+ xx<br>+ xx |
|---|---|
| xx<br>+ xx | xx<br>+ xx |
| xx<br>+ xx | xx<br>+ xx |

For the fifth group of operations, 4-to-2 compressors can be used again, as shown in Table 6. These operations may use the area of four more full adders.

TABLE 6

| xx<br>+ xx<br>+ xx<br>+ xx |
|---|
| xx<br>+ xx |
| xx<br>+ xx |

Up to this point, the area of 50 full adders may be used. Moreover, the number of bits still to be processed may be four bits. As shown in Table 7, the next operation is to find the sum. From the resulting three bits, the two-bit mod 3 value can be obtained.

TABLE 7

| xx<br>+ xx |
|---|
| xxx |

Note that, when performing the error checking, the group of operations in Tables 1-7 (or something similar to them) is performed for both input mantissas to the operation being checked. Then, the two resulting mod 3 values may be combined together using the operation being checked.

Moreover, a similar procedure is performed on the result of the operation applied to the original inputs (that is, the result that is being checked). For example, this result includes the sum and carry values from the carry-save adder if only the carry-save adder is being checked, or the result is the output of the carry look-ahead adder if both the carry-save adder and carry look-ahead adder are being checked for a multiply operation. If the product (mod 3) is not the same as the mod 3 of the result, then an error occurred.

Now consider mod 7. Using Eqns. 1 and 2, mod 7 (jihgfedcba)=mod 7 ((512*j)+(256*i)+(128*h)+(64*g)+(32*j)+(16*e)+(8*d)+(4*c)+(2*b)+(1*a))=mod 7 ((1*j)+(4*i)+(2*h)+(1*g)+(4*f)+(2*e)+(1*d)+(4*c)+(2*b)+(1*a)). Thus, mod 7 (jihgfedcba) can be determined by calculating mod 7 (j+ihg+fed+cba).

Recall that one of the inputs to the carry-save adder for the multiplier may be represented as 1ZYXWVUTSRQPONMLKJIHGFEDCBAzyxwvutsrqponmlkjihgfedcba, where the implicit 1 bit is represented as '1' and the 52 explicit bits are represented by letters of the alphabet. Then, as shown in Table 8, mod 7 (1ZYXWVUTSRQPONMLKJIHGFEDCBAzyxwvutsrqponmlkjihgfedcba) can be re-expressed using Eqns. 1 and 2.

TABLE 8

| mod 7 (01Z |
| --- |
| + YXW |
| + VUT |
| + SRQ |
| + PON |
| + MLK |
| + JIH |
| + GFE |
| + DCB |
| + Azy |
| + xwv |
| + uts |
| + rqp |
| + onm |
| + lkj |
| + ihg |
| + fed |
| + cba) |

Grouping three lines at a time in Table 8 (and, thus, defining groups of three-bits for mod 7) and using full adders, mod 7 can be re-expressed as shown in Table 9. In Table 9, 'SSS' represents the three sum bits output from the three full adders and 'KCC' represents the three carry bits output from the three full adders. Note that the K bit may be placed in the least significant bit position because mod 7 (8)=1. After completing the full additions, the 53 initial bits may be reduced to 36 bits. Moreover, noted for area evaluation, the operations shown in Table 9 may include 18 full adders.

TABLE 9

| 01Z | SRQ | JIH | Azy | rqp | ihg |
| --- | --- | --- | --- | --- | --- |
| + YXW | + PON | + GFE | + xwv | + onm | + fed |
| + VUT | + MLK | + DCB | + uts | + lkj | + cba |
| SSS | SSS | SSS | SSS | SSS | SSS |
| + KCC | + KCC | + KCC | + KCC | + KCC | + KCC |
| SSS | SSS | SSS | SSS | SSS | SSS |
| + CCK | + CCK | + CCK | + CCK | + CCK | + CCK |

Repeating this process again, mod 7 can be expressed as shown in Table 10. After these additional full adders, there may be 24 bits. Moreover, noted for area evaluation, the operations shown in Table 10 may include 12 full adders.

TABLE 10

| SSS | CCK | SSS | CCK |
| --- | --- | --- | --- |
| CCK | SSS | CCK | SSS |
| SSS | CCK | SSS | CCK |
| sss | sss | sss | sss |
| + kcc | + kcc | + kcc | + kcc |
| sss | sss | sss | sss |
| + cck | + cck | + cck | + cck |

In the third group of operations, 4-to-2 compressors may be used as shown in Table 11, where the sum and carry bits are represented by 'x'. Note that in order to use 4-to-2 compressors, the 'early out' (not shown) from the 1's position may be the 'late in' to the 2's position and the 'early out' (not shown) from the 2's position may be the 'late in' to the 4's position. In traditional usage, the 'early out' from the 4's position would become the 'late in' to the 8's position. However, because mod 7 (8)=1, the 'early out' from the 4's position may be used as the 'late in' to the 1's position (instead of zero for the 'late in' to the 1's position). Moreover, the 4-to-2 compressors in Table 11 may use the area of 12 full adders.

TABLE 11

| sss | sss |
| --- | --- |
| + cck | + cck |
| sss | sss |
| + cck | + cck |
| xxx | xxx |
| + xxx | + xxx |
| xxx | xxx |
| + xxx | + xxx |

For the fourth group of operations, 4-to-2 compressors may be used again, as shown in Table 12. Note that these 4-to-2 compressors may use the area of six full adders.

TABLE 12

| xxx |
| --- |
| + xxx |
| + xxx |
| + xxx |
| xxx |
| + xxx |
| xxx |
| + xxx |

Up to this point, the area of 48 full adders may be used. Moreover, there may be 6 bits still to be processed. As shown in Table 13, the next operation is to find the sum. From the resulting four bits, the three-bit mod 7 value can be obtained.

TABLE 13

| xxx |
| --- |
| + xxx |
| xxxx |

Note that, for example, when performing the error checking for multiplication, the group of operations in Tables 8-13 (or something similar to them) is performed for both input mantissas to a carry-save adder. Then, the two resulting mod 7 values may be multiplied together.

Moreover, a similar procedure is performed on the result of the multiplication operation. If the product (mod 7) is not the same as the mod 7 of the result, then an error occurred.

Note that mod 3 error checking can catch some of the errors that mod 7 error checking may not catch, and that mod 7 error checking can catch some of the errors that mod 3 error checking may not catch. Consequently, there may be an advantage to doing both mod 3 and mod 7 error checking, if the area and cost penalty of doing both types of error checking can be addressed.

We now describe a technique for calculating two or more moduli using a shared circuit, which overcomes the aforementioned problem. The resulting error-checking circuit may have an area which is slightly larger than the area of an error-checking circuit that performs only one modulus (such as mod 3), and is much less than the sum of the area for a circuit that performs one modulus plus the area for a completely separate circuit that performs another modulus.

Recall that for mod 3, mod 3 (jihgfedcba)=mod 3 ((512*j)+(256*i)+(128*h)+(64*g)+(32*j)+(16*e)+(8*d)+(4*c)+(2*b)+(1*a))=mod 3 ((2*j)+(1*i)+(2*h)+(1*g)+(2*f)+

(1*e)+(2*d)+(1*c)+(2*b)+(1*a)). Moreover, note that every other position has the value of '1' and the other positions have the value of '2'.

Additionally, recall that for mod 7, mod 7 (jihgfedcba)= mod 7 ((512*j)+(256*i)+(128*h)+(64*g)+(32*j)+(16*e)+ (8*d)+(4*c)+(2*b)+(1*a))=mod 7 ((1*j)+(4*i)+(2*h)+ (1*g)+(4*f)+(2*e)+(1*d)+(4*c)+(2*b)+(1*a)). Here, every third position has the value of '1', every third position has the value of '2', and the remaining positions have the value of '4'.

Once again, the 53-bit mantissa for floating-point double precision is represented as 1ZYXWVUTSRQPONMLKJIH-GFEDCBAzyxwvutsrqponmlkjihgfedcba. Table 14 indicates the mod value in each bit position for both mod 3 and mod 7. These mod values were described previously.

TABLE 14

| 1ZYXWVUTSRQRONMLKJIHGFEDCBAzyxwvutsrqponmlkjihgfedcba |
|---|
| for mod 3  121212121212121212121212121212121212121212121212121 |
| for mod 7  214214214214214214214214214214214214214214214421421 |

As shown in Table 15, the values for these bit positions can be grouped in subsets of six bits each. Note that, if the subsets of six bits are added, the results are valid for both mod 3 and mod 7, i.e., the addition operations are common to both modulus calculations.

TABLE 15

|  | 01ZYXW | VUTSRQ | PONMLK | JIHGFE |
|---|---|---|---|---|
| for mod 3 | 212121 | 212121 | 212121 | 212121 |
| for mod 7 | 421421 | 421421 | 421421 | 421421 |
|  | DCBAzy | xwvuts | rqponm | lkjihg | fedcba |
| for mod 3 | 212121 | 212121 | 212121 | 212121 | 212121 |
| for mod 7 | 421421 | 421421 | 421421 | 421421 | 421421 |

These addition operations are shown in Table 16. In Table 16, 'SSSSSS' represents the six sum bits output from the six full adders and 'KCCCCC' represents the six carry bits output from the six full adders. Note that the K bit in row 5 of Table 16 may be placed in the least significant bit position in row 7 of Table 16 because mod 7 (64)=1 and mod 3 (64)=1. Moreover, these 18 full adders may be shared by both the mod 3 and mod 7 calculations, saving 18 full adders from doing them separately. Additionally, after completing the full additions, the initial 53 bits may be reduced to 36 bits.

TABLE 16

```
  01ZYXW        JIHGFE        rqponm
+ VUTSRQ      + DCBAzy      + lkjihg
+ PONMLK      + xwvuts      + fedcba
  ──────        ──────        ──────
  SSSSSS        SSSSSS        SSSSSS
+ KCCCCC      + KCCCCC      + KCCCCC
  ──────        ──────        ──────
  SSSSSS        SSSSSS        SSSSSS
+ CCCCCK      + CCCCCK      + CCCCCK
  ──────        ──────        ──────
```

Repeating this process, the moduli can be expressed as shown in Table 17. After the additional full additions, there may be 24 bits. Note that there may be 12 full adders at this portion of the calculation that are shared during the mod 3 and the mod 7 calculations.

TABLE 17

```
  SSSSSS        CCCCCK
+ CCCCCK      + SSSSSS
  SSSSSS        CCCCCK
  ──────        ──────
  SSSSSS        SSSSSS
+ KCCCCC      + KCCCCC
  ──────        ──────
  SSSSSS        SSSSSS
+ CCCCCK      + CCCCCK
  ──────        ──────
```

Next, for the third group of operations, 4-to-2 compressors can be used as shown in Table 18, where the sum and carry bits are represented by 'x'. Note that in order to use the 4-to-2 compressors, the 'early out' (not shown) from the 1's position may be the 'late in' to the 2's position and the 'early out' (not shown) from the 2's position may be the 'late in' to the 4's position. Similarly, the 'early out' from the 4's, 8's, and 16's positions may be the 'late in' to the 8's, 16's, and 32's position, respectively. In traditional usage, the 'early out' from the 32's position would become the 'late in' to the 64's position. However, because mod 7 (64)=1 and mod 3 (64)=1, the 'early out' from the 32's position may be used as the 'late in' to the 1's position (instead of zero for the 'late in' to the 1's position). Moreover, the six 4-to-2 compressors described in Table 18 may use the area of 12 full adders and, once again, may be shared by both the mod 3 and mod 7 calculations. Note that the total full adder area that is shared may be 42.

TABLE 18

```
  SSSSSS
+ CCCCCK
+ SSSSSS
+ CCCCCK
  ──────
  xxxxxx
+ xxxxxx
  ──────
  xxxxxx
+ xxxxxx
  ──────
```

At this point, separate circuits may be used for the mod 3 and mod 7 calculations. For mod 3, four full adders may be used, as shown in Table 19, followed by two 4-to-2 compressors, as shown in Table 20. Note that, for these two groups of operations for mod 3 only, the area of eight full adders may be used. Moreover, following Table 20, the calculation may proceed as described previously for mod 3, which may not use much additional area.

TABLE 19

```
    xx              xx
  + xx           + xx
  + xx           + xx
  ----            ----
    xx              xx
  + xx           + xx
  ----            ----
    xx              xx
  + xx           + xx
  ----            ----
```

TABLE 20

```
    xx
  + xx
  + xx
  + xx
  ----
    xx
  + xx
  ----
    xx
  + xx
  ----
```

For mod 7, following Table 18, three 4-to-2 compressors may be used, as shown in Table 21. This may use the area of six full adders for mod 7 only. Moreover, the remaining calculations after Table 21 may not use much additional area.

TABLE 21

```
    xxx
  + xxx
  + xxx
  + xxx
  -----
    xxx
  + xxx
  -----
    xxx
  + xxx
  -----
```

In summary, in the preceding embodiment mod 3 may use the area of 50 full adders plus some small additional area for the final sum, and mod 7 may use the area of 48 full adders plus some small additional area for the final sum. The combined calculation may use the area of 56 full adders (42 shared +8 for mod 3 only +6 for mod 7) plus the two additional small areas for the final sums.

While the preceding embodiments use a 53-bit input as an illustration, note that the larger the number of bits in the input, the greater the percentage of the full-adder area that can be shared by the mod 3 and mod 7 calculations. In general, all the 'early' computation can be shared, with only a small area at the end of the calculation which is not shared. For example, if only the carry-save adder is being checked, then the output of the carry-save adder for floating-point double precision would be 106 sum bits and approximately 100 carry bits. (Note that the low-order six bits may be added out in the carry-save adder, so they may not have any carry bits.) The first level of sharing (or the first group of operations) may include 66 full adders. This leaves 132 bits plus 11 bits that are not used. In the second level of sharing (or the second group of operations), 36 4-to-2 compressors may use the area of 72 full adders, and in the third level of sharing (or the third group of operations), 18 4-to-2 compressors may use the area of 36 full adders. Moreover, in the fourth level of sharing (or the fourth group of operations), 12 full adders may be used, and in the fifth and last level of sharing (or the fifth group of operations), four 4-to-2 compressors may use the area of 8 full adders. At this point, the configuration of bits may be exactly the same as at the end of sharing in the 53-bit input example described in Tables 14-21. Therefore, for the 206-bit input, the area of 194 full adders may be shared, the area of 8 full adders may be used for mod 3 only, and the area of 6 full adders may be used for mod 7 only.

Note that the ability to share a circuit when calculating moduli can be generalized for specific prime numbers. In particular, if the prime number is a Mersenne prime number (or when the binary representation of the prime number only contains 1s), it can be expressed using a characteristic number (such as N consecutive bits in binary representation). For example, for a given Mersenne prime number, the characteristic number is the power N in $2^N-1$ that equals the given Mersenne prime number. For mod 3 N is 2, for mod 7 N is 3, and for mod 31 N is 5.

Modulus circuits for mod 3 and mod 7 can be at least partially combined using cyclic permutation or wrap around (in which the 'early out' of the last 4-to-2 compressor in a sequence of 4-to-2 compressors becomes the 'late in' for the first 4-to-2 compressor in the sequence of 4-to-2 compressors) by using a modulus circuit that has a characteristic number which is greater than or equal to the product of the characteristic numbers of 3 and 7. In particular, the modulus circuit may have a width that is a positive integer multiple of the number of bits in the binary representation of 3 (namely, 2) and a positive multiple of the number of bits in the binary representation of 7 (namely, 3). For example, for mod 3 and mod 7, a width N of 6 (which is a multiple of 2 and 3) can be used. In this example, $2^6-1$ equals 63, and 63 is 9 times 7. Thus, a modulus circuit for mod 63 can be used to implement at least a portion of mod 3 and mod 7 (i.e., it may be used as a shared circuit).

Note that in some embodiments the moduli in the preceding embodiments are computed on a portion of the first number and the second number. Alternatively or additionally, the moduli may be computed somewhere during the sequence of operations shown in Tables 14-21. For example, error checking may be performed on at least a portion of operations, such as (A*B)+C. In particular, A and B may be multiplied to generate partial products that are summed using a carry-save adder and a full adder (which adds the last two partial products X, the sum, and Y, the carry), and a carry look-ahead adder may sum the output of A*B with C (whose position may be shifted to logically align with the output of A*B). The multiplication of A and B may be error checked by computing the modulus of A, the modulus of B, and the moduli of inputs X and Y to the full adder (i.e., by using partial products and, thus, before the product of A and B is determined). In an exemplary embodiment, A and B are each 53 bits, and the inputs X and Y to the full adder have, respectively, 106 and 100 bits. Thus, error checking may be performed by computing the moduli of approximately 200 bits. This approach may be cheaper and faster than determining the modulus of the product of A and B.

In some embodiments, computer system 100 (FIG. 1), full adder 200 (FIG. 2A), 4-to-2 compressor 220 (FIG. 2B), and 4-to-2 compressor 240 (FIG. 2C) include fewer or additional components. Moreover, two or more components may be combined into a single component and/or a position of one or more components may be changed.

Figure 3:
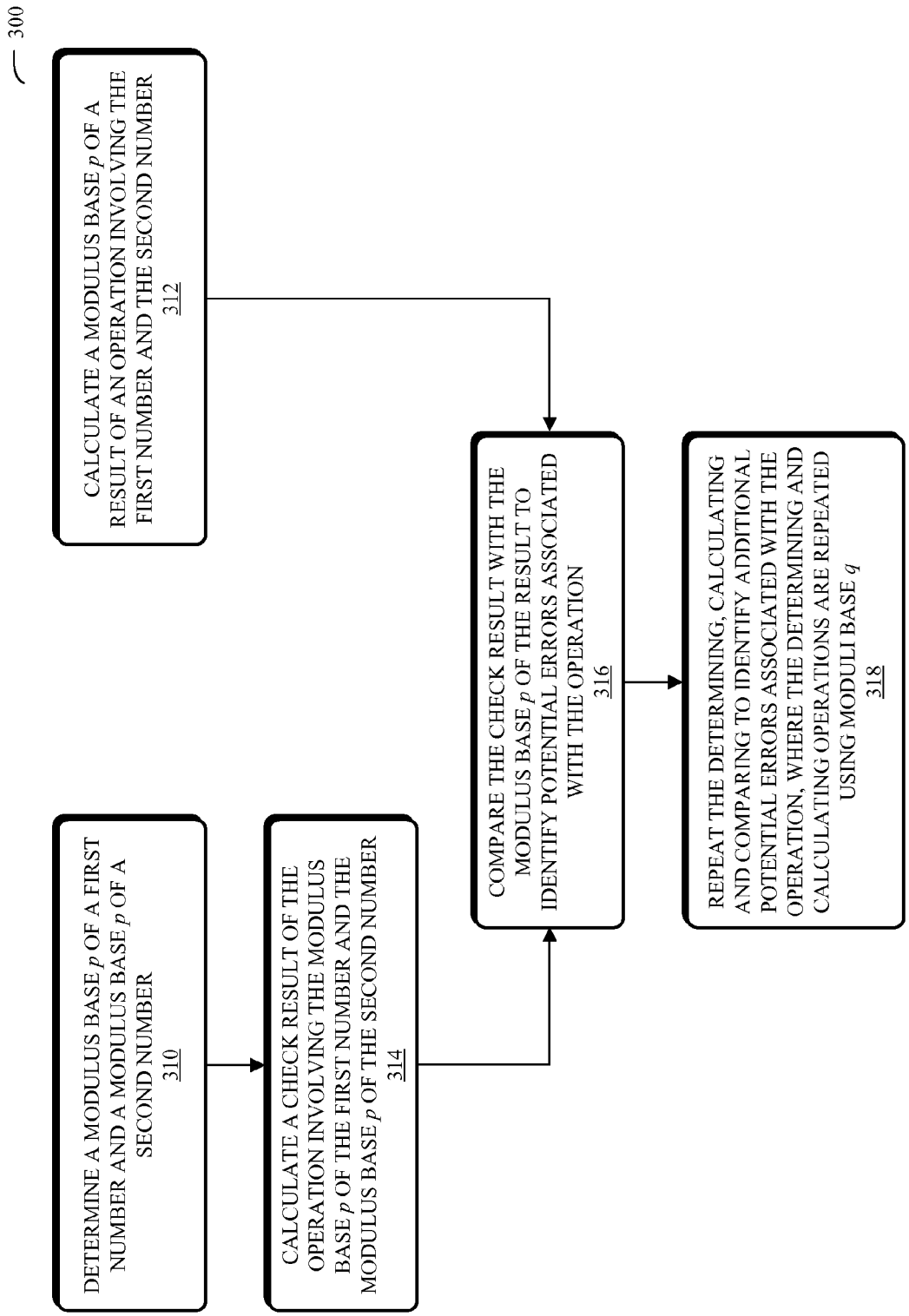
FIG. 3 is a flowchart illustrating a process for checking a result of an operation involving a first number and a second number in accordance with an embodiment of the present invention.

We now discuss methods for error checking a result of an operation. FIG. 3 presents a flowchart illustrating a process 300 for checking a result of an operation involving a first number and a second number, which may be performed by a modulus circuit. During this process, the modulus circuit determines a modulus base p of the first number and a modulus base p of the second number (310). Also, the modulus circuit calculates a modulus base p of a result of the operation involving the first number and the second number (312). Then, the modulus circuit obtains a check result of the operation involving the modulus base p of the first number and the modulus base p of the second number (314). Next, the modulus circuit compares the check result with the modulus base p of the result to identify potential errors associated with the operation (316). Moreover, the modulus circuit repeats (318) the determining, calculating, and comparing to identify additional potential errors associated with the operation, where the determining and calculating operations are repeated using moduli base q.

Note that p and q are Mersenne prime numbers, and that the moduli base p and base q are computed using a shared circuit that performs additions within operation (310) and (314) using one or more subsets of bits in the first number and the second number. Additionally, the number of bits in a given subset is greater than or equal to the product of a first characteristic number associated with the modulus base p and a second characteristic number associated with the modulus base q. For example, the number of bits in the given subset may be a positive integer multiple of the number of bits in p and the number of bits in q.

In some embodiments, the modulus circuit performs operation (314) after optionally logically aligning the subsets of the bits.

In some embodiments, the repeating (318) of the determining, calculating, and comparing using moduli base q is performed substantially concurrently with a first instance of these operations using moduli base p. Moreover, at least some of the additions in operations (310) and (314) may be performed using 4-to-2 compressor circuits, which may be included in the shared circuit.

In some embodiments of process 300 there may be additional or fewer operations. Moreover, the order of the operations may be changed and/or two or more operations may be combined into a single operation. Additionally, the preceding operations may be implemented using hardware and/or software, as is known in the art.

Devices and circuits described herein may be implemented using computer-aided design tools available in the art, and embodied by computer-readable files containing software descriptions of such circuits. These software descriptions may be: behavioral, register transfer, logic component, transistor and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3-½ inch floppy media, CDs, DVDs, and so on.

Figure 4:
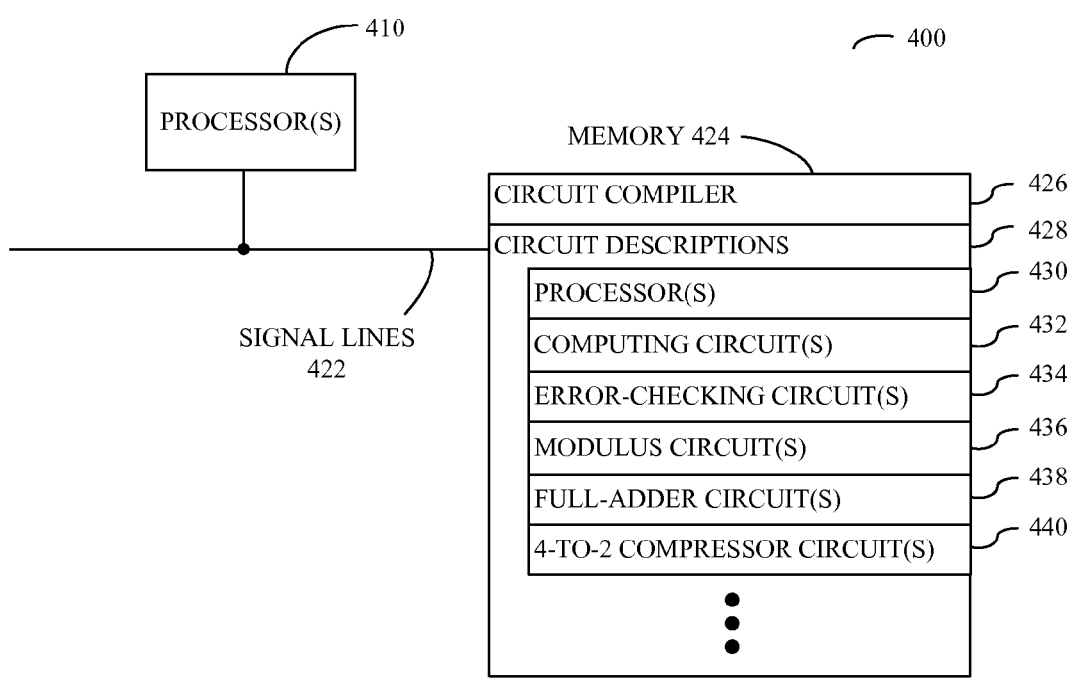
FIG. 4 is a block diagram illustrating a system in accordance with an embodiment of the present invention.

FIG. 4 presents a block diagram illustrating an embodiment of a system 400 that stores such computer-readable files. This system may include at least one data processor or central processing unit (CPU) 410, memory 424 and one or more signal wires or communication busses 422 for coupling these components to one another. Memory 424 may include high-speed random access memory and/or non-volatile memory, such as: ROM, RAM, EPROM, EEPROM, flash, one or more smart cards, one or more magnetic disc storage devices, and/or one or more optical storage devices.

Memory 424 may store a circuit compiler 426 and circuit descriptions 428. Circuit descriptions 428 may include descriptions of the circuits, or a subset of the circuits discussed above with respect to FIGS. 1 and 2. In particular, circuit descriptions 428 may include circuit descriptions of: one or more processors 430, one or more computing circuits 432, one or more error-checking circuits 434, one or more modulus circuits 436, one or more full-adder circuits 438, and/or one or more 4-to-2 compressor circuits 440.

In some embodiments, system 400 includes fewer or additional components. Moreover, two or more components may be combined into a single component and/or a position of one or more components may be changed.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for checking a result of an operation involving a first number and a second number, comprising:
    determining a modulus base p of the first number and a modulus base p of the second number;
    performing the operation using the modulus base p of the first number and the modulus base p of the second number;
    calculating a modulus base p of a result of the operation involving the first number and the second number;
    comparing a result of the performing of the operation with a result of the calculation to identify potential errors associated with the operation; and
    repeating the determining, performing, calculating, and comparing operations to identify additional potential errors associated with the operation, wherein the determining and calculating operations are repeated using moduli base q;
    wherein p and q are Mersenne prime numbers;
    wherein the moduli base p and base q are computed using a shared circuit that performs additions using subsets of consecutive bits in the first number and the second number;
    wherein the number of bits in a given subset is greater than or equal to the product of a first characteristic number associated with the modulus base p and a second characteristic number associated with the modulus base q; and
    wherein a given characteristic number associated with a given modulus base is a number of bits in a binary representation of the given modulus base.

2. The method of claim 1, wherein the operation includes multiplication or addition; and
    wherein the multiplication includes a full product of the first number and the second number or a partial product, in which some of the bits in the first number and the second number are multiplied.

3. The method of claim 1, wherein the repeating of the determining, performing, calculating, and comparing operations is performed concurrently with a first instance of these operations.

4. The method of claim 1, wherein the shared circuit performs the additions after logically aligning the subsets of the bits.

5. The method of claim 1, wherein at least some of the additions are performed using 4-to-2 compressor circuits.

6. The method of claim 1, wherein p is 3 and the first characteristic number is 2, p is 7 and the first characteristic number is 3, or p is 31 and the first characteristic number is 5.

7. The method of claim 6, wherein q is 3 and the second characteristic number is 2, q is 7 and the second characteristic number is 3, or q is 31 and the second characteristic number is 5; and wherein p is different than q.

8. The method of claim 1, wherein p is different than q.

9. A modulus circuit configured to determine moduli of an input using shared addition circuits that add subsets of consecutive bits in the input, wherein the input can be a first number, a second number, or a result of an operation involving the first number and the second number;

wherein the moduli include a modulus base p and a modulus base q;

wherein p and q are Mersenne prime numbers;

wherein the number of bits in a given subset is greater than or equal to the product of a first characteristic number associated with the modulus base p and a second characteristic number associated with the modulus base q; and wherein a given characteristic number associated with a given modulus base is a number of bits in a binary representation of the given modulus base.

10. The modulus circuit of claim 9, wherein the moduli are used to check a result of the operation involving the first number and the second number.

11. The modulus circuit of claim 9, wherein the operation includes multiplication or addition; and wherein the multiplication includes a full product of the first number and the second number or a partial product, in which some of the bits in the first number and the second number are multiplied.

12. The modulus circuit of claim 9, wherein the shared addition circuits perform additions after logically aligning the subsets of the bits.

13. The modulus circuit of claim 9, wherein at least some of the shared addition circuits include full-adder circuits.

14. The modulus circuit of claim 9, wherein at least some of the shared addition circuits include 4-to-2 compressor circuits.

15. The modulus circuit of claim 9, wherein p is 3 and the first characteristic number is 2, p is 7 and the first characteristic number is 3, or p is 31 and the first characteristic number is 5.

16. The modulus circuit of claim 15, wherein q is 3 and the second characteristic number is 2, q is 7 and the second characteristic number is 3, or q is 31 and the second characteristic number is 5; and wherein p is different than q.

17. The modulus circuit of claim 9, wherein p is different than q.

18. The modulus circuit of claim 9, wherein the modulus circuit is disposed on an integrated circuit.

19. A computer system, comprising an integrated circuit that includes a modulus circuit which is configured to determine moduli of an input using shared addition circuits that add subsets of consecutive bits in the input, wherein the input can be a first number, a second number, or a result of an operation involving the first number and the second number;

wherein the moduli include a modulus base p and a modulus base q;

wherein p and q are Mersenne prime numbers;

wherein the number of bits in a given subset is greater than or equal to the product of a first characteristic number associated with the modulus base p and a second characteristic number associated with the modulus base q; and wherein a given characteristic number associated with a given modulus base is a number of bits in a binary representation of the given modulus base.

20. The computer system of claim 19, wherein the moduli are used to check a result of the operation involving the first number and the second number.

* * * * *